Figure 1:
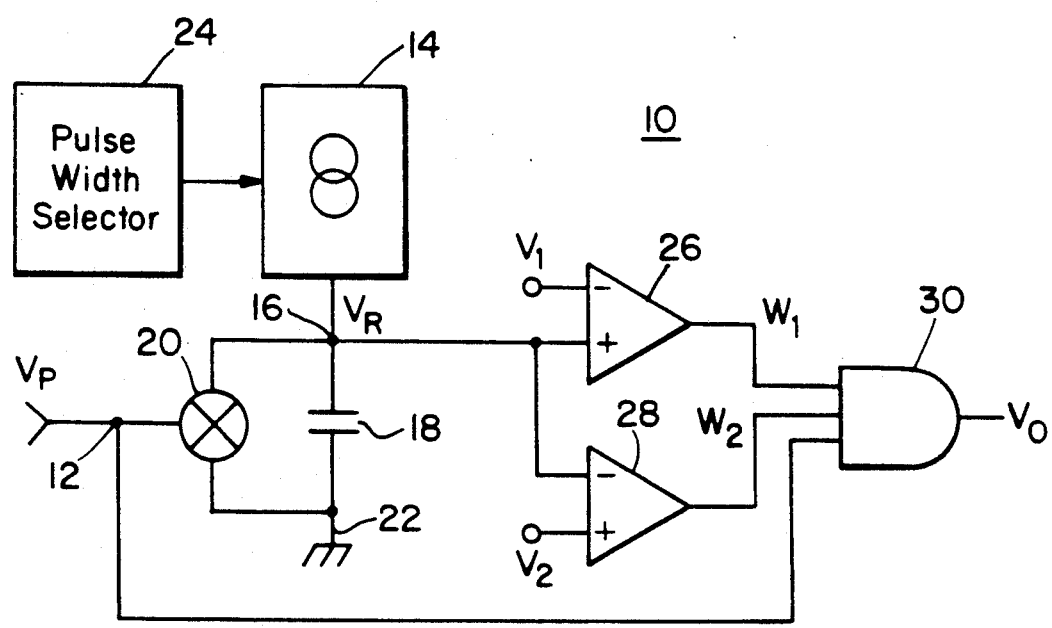

United States Patent [19]

McMorrow, Jr. et al.

[11] Patent Number: 5,220,203

[45] Date of Patent: Jun. 15, 1993

[54] VARIABLE PULSE WIDTH PRECISION PULSE GENERATOR

[75] Inventors: Richard H. McMorrow, Jr., Lincoln; Hans Weedon, Salem; Enrico Dolazza, Boston, all of Mass.

[73] Assignee: Analogic Corporation, Peabody, Mass.

[21] Appl. No.: 616,437

[22] Filed: Nov. 21, 1990

[51] Int. Cl.[5] ............... H03K 5/04; H03K 5/22; H03K 4/08; G06G 7/18

[52] U.S. Cl. ................... 307/265; 307/360; 307/494; 307/228; 328/58; 328/127; 328/146

[58] Field of Search ............ 307/265, 360, 494, 228; 328/127, 58, 146, 147

[56] References Cited

U.S. PATENT DOCUMENTS

| | | | |
|---|---|---|---|
| 3,708,765 | 1/1972 | Salamon et al. | 328/58 |
| 3,820,029 | 6/1974 | McKinley | 328/58 |
| 3,961,271 | 6/1976 | Zlydak et al. | 307/360 |
| 4,820,940 | 4/1989 | Wachi et al. | 307/228 |
| 5,045,800 | 9/1991 | Kung | 307/265 |

*Primary Examiner*—Stanley D. Miller
*Assistant Examiner*—Trong Phan
*Attorney, Agent, or Firm*—Iandiorio & Dingman

[57] ABSTRACT

A variable pulse width precision pulse generator includes a constant current source for producing a number of different constant currents; a charge storage device whose voltage output is proportional to the charge stored; and gating means responsive to an input signal for controlling the time during which the constant current source charges the charge storage device to produce a ramp voltage; a first comparator responsive to the voltage ramp for detecting a first level of the ramp; a second comparator responsive to the voltage ramp for detecting a second level of the ramp; and logic means responsive to the comparators for providing a precision pulse during the presence of the input signal between the occurrence of the detection of the first and second levels of the ramp by the comparators.

6 Claims, 2 Drawing Sheets

VARIABLE PULSE WIDTH PRECISION PULSE GENERATOR

FIELD OF INVENTION

This invention relates to a variable pulse width precision pulse generator, and more particularly to such a pulse generator whose pulse duration is a function of a ramp voltage derived from a constant current source.

BACKGROUND OF INVENTION

In certain high-speed applications such as A/D conversions, in image processing systems such as shown in copending application entitled voltage to current conversion switching system, filed on even date herewith, by Richard H. McMorrow Jr. and Hans Weedon and assigned to the same assignee, incorporated herein by reference, it is desirable to provide integration windows as small as six nanoseconds. In such applications the window should be constant in duration over a short period of time (up to one second) with a precision related to the number of bits of the A/D converter. For example, for a ten bit A/D converter the duration of the window during the one second or less period should be stable and with a precision of one part in a thousand. For a six nanosecond window that is a tolerance of six picoseconds or less. Currently, precision of this degree is accomplished with pulse reflection techniques using unterminated cable delay lines of proper length. This is not easily adjustable: the system has to switch between cables of different lengths to get different delays and thus different pulse lengths. Such precise windows are desirable to generate pulses which time integration periods preliminarily to A/D conversions.

SUMMARY OF INVENTION

It is therefore an object of this invention to provide an improved pulse generator.

It is a further object of this invention to provide such a pulse generator which provides variable length pulses with high precision.

It is a further object of this invention to provide such a pulse generator which is extremely stable even at high speeds.

It is a further object of this invention to provide such a pulse generator which is capable of producing variable pulse width precision pulses down to the nanosecond range with precision in the picosecond range.

It is a further object of this invention to provide such a pulse generator in which the precision is one part in a thousand even in the nanosecond pulse range.

It is a further object of this invention to provide such a pulse generator in which the precision uncertainty varies similarly with the pulse width of the pulse itself so that the relative precision remains virtually constant.

It is a further object of this invention to provide a simple, low-cost, reliable pulse generator which provides high precision, variable pulse width pulse generation.

The invention results from the realization that a truly variable but precise pulse generator can be achieved by creating a pulse in response to an input signal during a pulse period defined by the occurrence of the detection of two different voltages on a voltage ramp whose slope depends on the level of the constant current supplied to a capacitor which creates the ramp voltage.

This invention features a variable pulse width precision pulse generator including a constant current source for producing a number of different constant currents. There is a charge storage device whose output is proportional to the charge stored, and gating means responsive to an input signal for controlling the time during which the constant current source charges the charge storage device to produce a ramp voltage. A first comparator responds to the voltage ramp for detecting a first level of the ramp, and a second comparator responds to the voltage ramp for detecting a second level of the ramp. Logic means responds to the comparators to provide a precision pulse during the presence of the input signal between the occurrence of the detection of the first and second levels of the ramp by the comparators.

In a preferred embodiment, the charge storage device may be a capacitor. The constant current source may include pulse width selection means for selecting a constant current value for producing a ramp voltage representative of a desired pulse width. The gating means may be arranged to shunt the charge storage device to ground alternately to enable charging and discharging of the charge storage device. Each of the comparators may include a reference input for defining the ramp level to be detected. The logic means may be an AND gate.

DISCLOSURE OF PREFERRED EMBODIMENT

Figure 2:
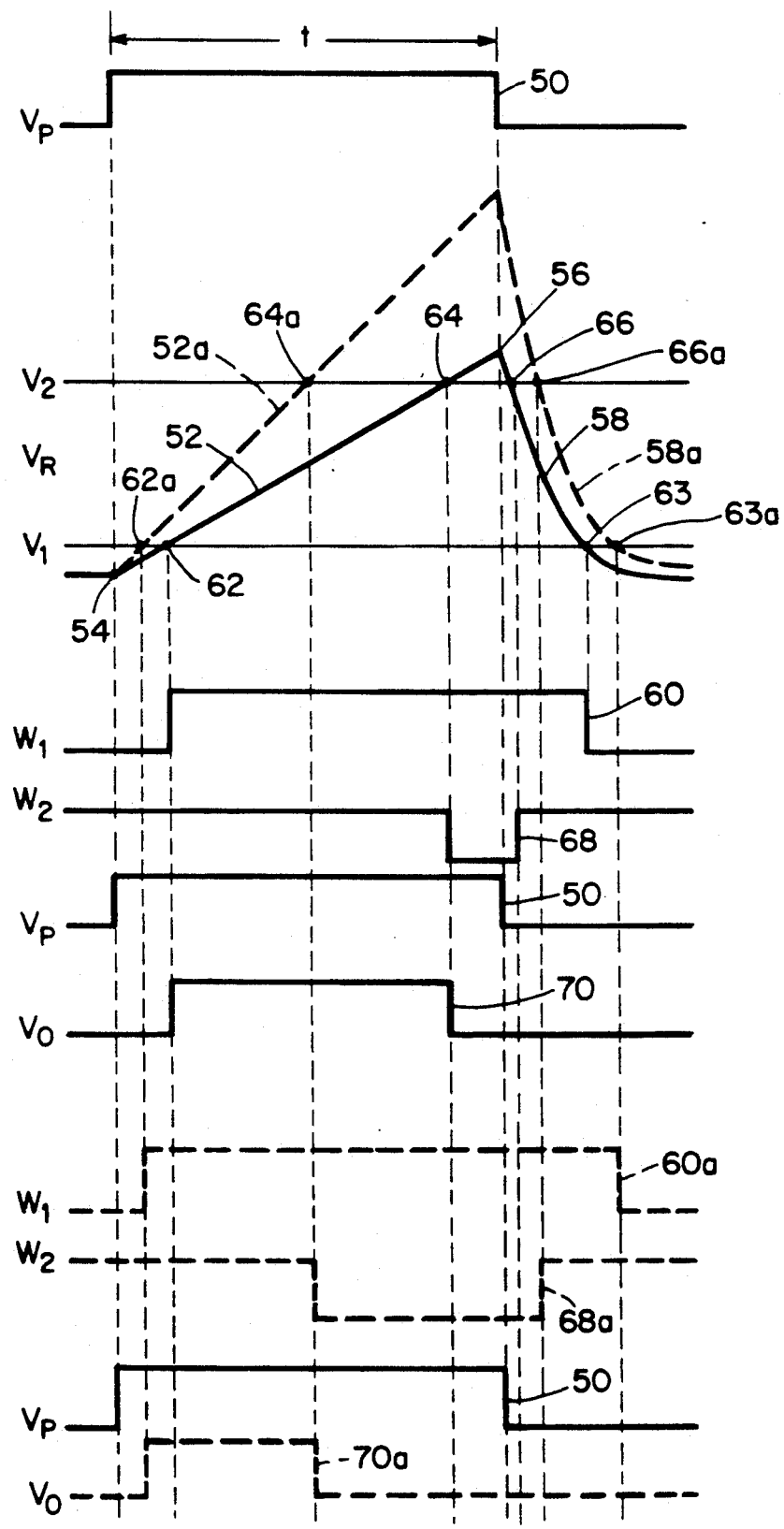

Other objects, features and advantages will occur to those skilled in the art from the following description of a preferred embodiment and the accompanying drawings, in which:

FIG. 1 is a schematic block diagram of a variable pulse width precision pulse generator according to this invention; and FIG. 2 is an illustration of the waveforms which occur in the pulse generator of FIG. 1.

The invention may be accomplished in a variable pulse width precision pulse generator which has a constant current source such as a FET with OP-Amp feedback stabilization for producing a number of different constant currents, for example 2, 4, 6, 8 and 16 milliamps. The constant current source charges a storage device such as a capacitor whose voltage output is proportional to the charge stored. A gating means responsive to an input signal controls the time during which the constant current source charges the capacitor to produce a ramp voltage. The input voltage is any clocking signal from which it is desired to make a precision pulse which may be used, for example, to create a window for A/D conversion applications. While the ramp is rising a pair of matched comparators detect two different points along the ramp which define the precise width of the pulse to be created. A logic device such as an AND circuit responds to the conjunction of the detections by both comparators and the original input signal to create the final precision pulse. The ramp detection by the first comparator starts the pulse, the ramp detection of the second comparator ends the pulse, and the pulse continues between those two detections for so long as the input pulse is present, i.e., the input pulse must be longer than the desired pulse. The output is also "anded" with the output to eliminate "glitches" from the discharge of the ramp-producing capacitor.

There is shown in FIG. 1 a variable pulse width precision pulse generator 10 which receives a clocking signal $V_P$ at its input terminal 12. Constant current source 14 provides a constant current to junction 16 which connects to a charge storage device such as capacitor 18. When the signal $V_P$ switches on gate 20, capacitor 18 is shunted to ground and the current flows from constant current source 14 through junction 16 and switch 20, to ground 22. However, when gate 20 is opened, the current flows from junction 16 through capacitor 18 to ground 22 and charges capacitor 18. Constant current source 14 is capable of providing a number of different constant current levels which may be selected by the operation of pulse width selector 24. Pulse width selector 24 may be simply a gain control which varies the gain of constant current source 14. The output of capacitor 18, voltage $V_R$, is a ramp voltage which is applied to comparators 26 and 28, each of which is also supplied with a reference voltage input $V_1$ and $V_2$, respectively. Comparator 26 detects the point at which the ramp $V_R$ reaches voltage $V_1$ and provides an output $W_1$ representative thereof. Comparator 28 provides an output when ramp $V_R$ reaches a second, higher threshold level $V_2$. When the outputs $W_1$ and $W_2$ are present at AND gate 30, and there is also present the signal $V_P$, AND gate 30 provides a voltage signal $V_O$.

The operation of pulse generator 10 can better be understood with reference to the waveforms shown in FIG. 2, where input voltage $V_P$ includes a pulse 50 having a duration t. Ramp volta $V_R$ has a positive slope ramp 52 which begins at point 54 and ends at point 56 coincident with pulse 50 of voltage $V_P$ from which it is created. From point 56 onward, $V_R$ decays along the path 58. Voltage $W_1$ produced by matched comparator 26 is represented by pulse 60, which begins at the point 62 where ramp 52 crosses reference voltage $V_1$, and ends where the decaying portion 58 of $V_R$ descends and crosses once again reference voltage $V_1$ at point 63. The output voltage $W_2$ of matched comparator 28 similarly begins where ramp 52 crosses reference voltage $V_2$ at point 64, and ends where the decaying path 58 of $V_R$ once again crosses reference voltage $V_2$ at point 66, thus creating the pulse 68. Thus by joining the three voltages $W_1$, $W_2$ and $V_P$ together in AND gate 30, $V_O$, the output pulse 70, is created only during the period of time when $W_1$, $W_2$ and $V_P$ are all high. With this circuit a high precision, extremely stable pulse 70 may be constructed.

The ability to vary the width of pulse 70 can be seen by referring to the phantomed waveforms, FIG. 2. Thus if the pulse width selector 24 is adjusted so the constant current source 14 provides a higher current to capacitor 18, $V_R$ assumes a much steeper ramp portion 52a, for example, which has twice the positive slope of ramp 52. In that case ramp 52a intercepts reference voltage $V_1$ at an earlier point 62a and intercepts path 58a at a later time 63a to create pulse 60a constituting voltage $W_1$. Similarly, ramp 52a intercepts reference voltage $V_2$ earlier at point 64a and later at point 66a, as compared to ramp 52. This creates $W_2$ pulse 68a.

When pulses 60a and 68a are combined with the pulse 50 of $V_P$, the final pulse 70a $V_O$ is constructed having a duration or pulse width roughly half that of pulse 70; thus doubling the slope has halved the pulse width. This technique for establishing variable width but precision pulses also provides an additional advantage in that the precision uncertainty varies similarly with the width of the pulse itself so that the relative precision remains virtually constant. This can be seen with reference to the two ramp voltages 52 and 52a in FIG. 2. Even though the steeper ramp 52a creates a smaller output pulse 70a, the relative uncertainty of the pulse width precision remains the same because the distance from point 54 to point 62a associated with pulse 70a is considerably shorter than the distance from point 54 to point 62 which is associated with the larger pulse 60. Thus as the pulse has gotten shorter due to the slope doubling, the period of uncertainty has proportionately been reduced by half s that the relative precision remains the same. Polarity changes can allow use of an "OR" gate for element 30.

Although specific features of the invention are shown in some drawings and not others, this is for convenience only as each feature may be combined with any or all of the other features in accordance with the invention.

Other embodiments will occur to those skilled in the art and are within the following claim.

What is claimed is:

1. A variable pulse width precision pulse generator comprising:
   a constant current source means for producing a number of different constant currents;
   a charge storage device, responsive to said constant current source means, whose voltage output is proportional to the charge stored;
   gating means, responsive to an input signal, for controlling the time during which the constant current source charges said charge storage device to produce a ramp voltage;
   a first comparator responsive to said voltage ramp for detecting a first level of said ramp;
   a second comparator responsive to said voltage ramp for detecting a second level of said ramp; and
   logic means, responsive to said first and second comparators, for providing a precision pulse during the presence of the input signal between the occurrence of the detection of said first and second levels of said ramp by said comparators.

2. The variable pulse width precision pulse generator of claim 1 in which said charge storage device is a capacitor.

3. The variable pulse width precision pulse generator of claim 1 in which said constant current source includes pulse width selection means for selecting a constant current value for producing a ramp voltage representative of a desired pulse width.

4. The variable pulse width precision pulse generator of claim 2 in which said gating means shunts said charge storage device to ground to alternately enable charging and discharging of said charge storage device.

5. The variable pulse width precision pulse generator of claim 1 in which each of said comparators includes a reference input for defining the ramp level to be detected.

6. The variable pulse width precision pulse generator of claim 1 in which said logic means is an AND gate.

* * * * *